United States Patent [19]
Perry et al.

[11] Patent Number: 5,874,833
[45] Date of Patent: Feb. 23, 1999

[54] TRUE/COMPLEMENT OUTPUT BUS FOR REDUCED SIMULATANEOUS SWITCHING NOISE

[75] Inventors: Patrick Edward Perry, Essex Junction; Sebastian Theodore Ventrone, South Burlington, both of Vt.

[73] Assignee: International Business Machines Corporation, Armonk, N.Y.

[21] Appl. No.: 794,041

[22] Filed: Feb. 3, 1997

[51] Int. Cl.$^6$ .............................................. H03K 19/0175
[52] U.S. Cl. ................................. 326/26; 326/21; 326/82
[58] Field of Search ........................... 326/26–27, 82–83, 326/86, 21, 93, 90; 340/146.2

[56] References Cited

U.S. PATENT DOCUMENTS

| | | |
|---|---|---|
| 4,044,312 | 8/1977 | D'Ortenzio . |
| 4,155,071 | 5/1979 | Shamburger ......................... 340/146.2 |
| 4,163,211 | 7/1979 | Miura ................................... 340/146.2 |
| 4,495,626 | 1/1985 | Brunin et al. ............................. 375/19 |
| 4,587,445 | 5/1986 | Kanuma . |
| 4,667,337 | 5/1987 | Fletcher .................................... 377/41 |
| 4,724,340 | 2/1988 | Sood . |
| 4,728,927 | 3/1988 | Aman .................................. 340/146.2 |
| 4,857,765 | 8/1989 | Cahill et al. . |
| 4,975,698 | 12/1990 | Kagey ....................................... 341/96 |
| 5,142,167 | 8/1992 | Temple et al. . |
| 5,194,763 | 3/1993 | Suzuki et al. ............................ 326/86 |
| 5,227,678 | 7/1993 | Han et al. . |
| 5,406,247 | 4/1995 | Nagaraj ................................ 340/146.2 |
| 5,450,056 | 9/1995 | Jens ..................................... 340/146.2 |

OTHER PUBLICATIONS

"Delta–I Noise Reduction in Array Chip Addressing," *IBM Technical Disclosure Bulletin*, vol. 27, No. 2, Jul. 1984, pp. 1069–1070.

*Primary Examiner*—Jon Santamauro
*Attorney, Agent, or Firm*—Robert A. Walsh

[57] ABSTRACT

A true/complement integrated circuit device is disclosed for reducing an amount of simultaneous switching on a bus between a current state and a next state. The device includes a current state register connected to the bus for outputting the current state onto the bus during a first clock cycle. A next state register is provided for containing the next state, wherein the next state is a pending state of the bus intended for a next clock cycle. A comparison circuit compares a current state value in the current state register with a next state value in the next state register on a bit-by-bit basis to determine if the current state value and the next state value are of a same polarity or of an opposite polarity. A circuit is provided for determining a ratio of switching signals from an output of the bit-by-bit comparisons by the comparison circuit. The ratio determining circuit further generates a true/complement (T/C) signal having a first state if it is determined that more than a prescribed percentage of bits are in transition, the T/C signal having a second state otherwise. Lastly, a circuit is provided for complementing the bits of the next state register in response to the T/C signal being in the first state, and not complementing the bits of the next state register in response to the T/C signal being in the second state, prior to being transferred into the current state register and output onto the bus during the next clock cycle.

20 Claims, 8 Drawing Sheets

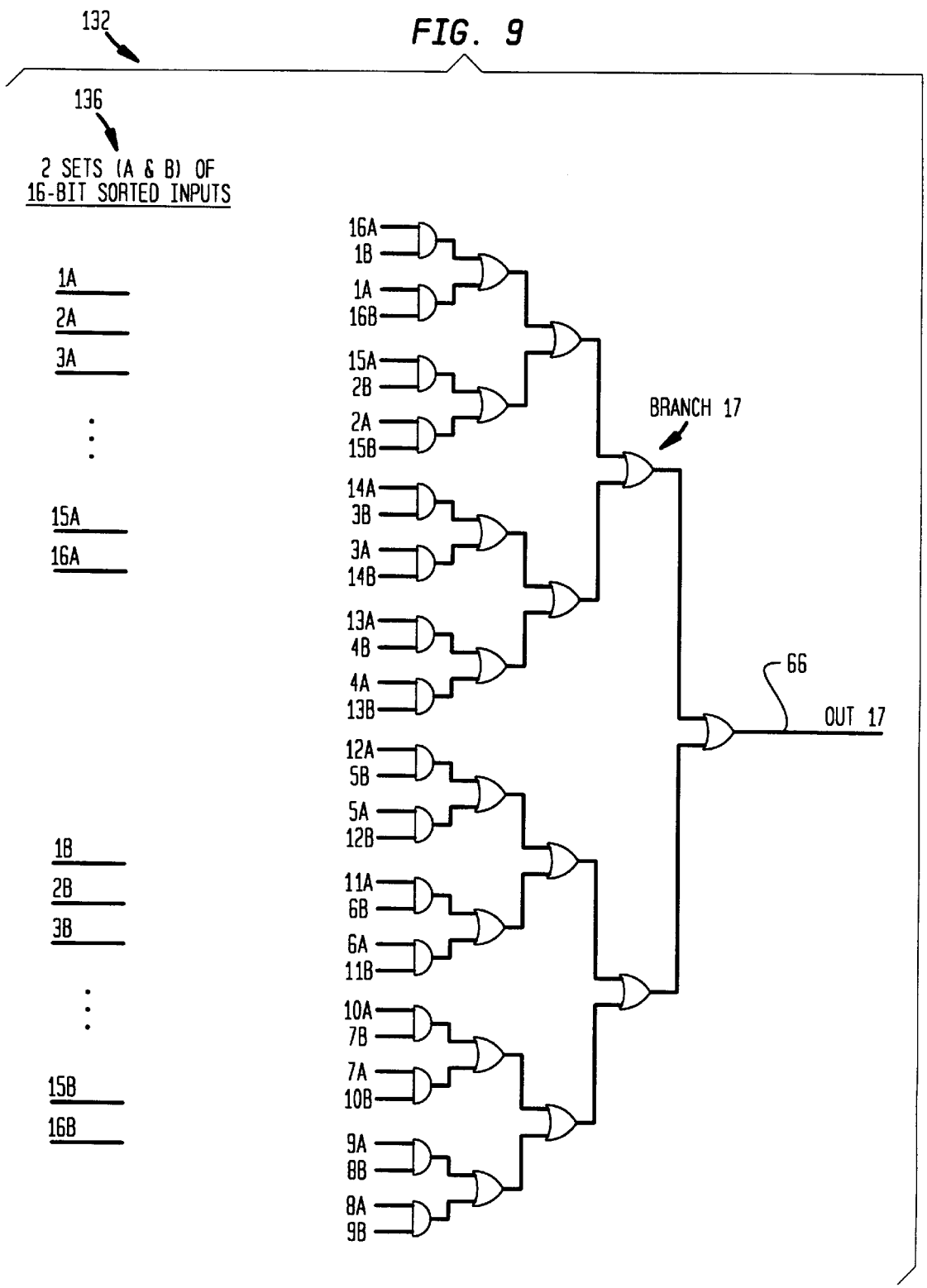

TRUE/COMPLEMENT OUTPUT BUS FOR REDUCED SIMULTANEOUS SWITCHING NOISE

BACKGROUND OF THE INVENTION

1. Field of the Invention

This invention relates generally to integrated circuits and, more particularly, to a method and apparatus for controlling simultaneous switching noise in an output bus configuration of very large scale integrated (VLSI) circuits.

2. Discussion of the Related Art

The fabrication of high performance VLSI devices permits the use of many functions on a single integrated circuit chip. The functional blocks on a single chip must be connected with a variety of other chips in order to receive data and communicate results within a computer system or other similar system. Communication between chips or functional blocks is faster when the data is transmitted in parallel over a large number of interconnections or bus. The electrical behavior of interconnections between functional blocks on a single chip is different than the behavior of interconnection between chips. The electrical resistance, capacitance, and inductance associated with packaging and interconnecting multiple chips affects the switching transitions of the signals sent between the chips. Therefore, the output drivers are used to compensate for these effects.

Output drivers generally drive a much larger capacitive load than an on-chip functional block would drive. To handle these large loads and meet required cycle times, output drivers have to drive high currents and have large di/dt's (corresponding to fast switching transition times). When a large number of these output drivers switch at the same time, the current demanded by the drivers can exceed the amount of current an integrated circuit package can supply to the on-chip power buses. When this happens, noise is generated on the chip and the buses "bounce" away from a card supply. The amount of noise depends on the speed of the drivers, the number of drivers switching, the design of the on-chip power buses and the electrical characteristics of the package. It is possible that the on-chip bus may be a volt or more away from the value of the same supply on the card. This much noise on a power supply can cause problems with signals being received on the same chip and can cause outputs that are not supposed to be switching to temporarily change states. Thus there exists a concern with simultaneous switching output drivers.

The stronger output signal coupled with a large number of output signals switching in parallel produces a noise problem on a single chip. Part of the noise problem is a result of a change in the current required by the input/output devices when many input/output devices are switched at once. The effects of the changes in current, also called current spikes, on the input/output devices vary depending on the placement of the drivers with respect to the power supply pins on the chip and the design of the power supply bussing. This is because current spikes must pass through the power supply bussing and its parasitic impedance. The placement of a switching input/output device with respect to the power supply pins changes the impedance which the current spikes encounter. Therefore, the voltage dropped across the impedance varies and this produces different effects on the input/output devices and other circuits near the input/output devices. In particular, when a current spike (i.e., noise) becomes large enough over a small enough impedance, an input/output device may (depending upon its position within a chip) switch its logical state unintentionally.

In an effort to reduce overall chip power consumption, the power supply bussing on a chip has the lowest impedance that is practical. A low impedance aggravates the noise problem because the current spike is not damped as it travels through the bussing so that it effects more circuits. Both a larger current spike and smaller impedances are likely when several input/output devices operate in parallel. Therefore, enhancing the signal speed and number of parallel input/output devices makes the chip communication more unreliable because the signals sent may not be correct due to the current noise (also referred to as Delta I noise) in the power supply.

Another part of the Delta I noise is that the current spike is an AC signal capacitively coupled to adjacent input/output devices through the parasitic capacitances between the input/output devices. The placement of the input/output devices determines the impedance through which the current spike passes. This impedance and size of the current spike determine the strength of the voltage signal capacitively coupled to the adjacent devices. If enough voltage is coupled to an adjacent input/output device through several input/output devices switching to one state simultaneously, and therefore having a cumulative effect, then the adjacent input/output device will switch logical state unintentionally. Again, switching logic signals are made more unreliable because of the Delta I noise.

As buses increase in size and transfer rates, the condition of simultaneous switching noise increases. The effect of this noise is a capping of a frequency and/or the increase in cost for packaging. At the same time, increasing complexity of processor architecture has resulted in the external bus to be the bottleneck. Some means of increasing the bus speed without increasing the simultaneous switching noise is needed.

Prior known solutions to this problem of simultaneous switching noise include the reducing of the speed of the transitions between the logic states of the input/output devices, however, the performance of the chip is undesirably limited by the Delta I noise. Another known technique is to filter out the current spikes. While filtering out the current spikes may be effective, the same may be prohibitively expensive because of packaging costs. Still another solution to the Delta I noise problem is to modify the parasitic elements on the power supply bussing for the chip itself. Typically, the later is done by using several input/output pins on the chip (rather than a single pin) for power supply connections. However, the number of input/output pins on a VLSI chip is generally limited. Therefore, the functionality of the chip is limited because the number of pins useful for logic signals is limited due to allocating extra pins for the power supply.

SUMMARY OF THE INVENTION

It is thus an object of the present invention to provide an enhancement to the reliability of signals sent between integrated circuit chips.

It is further an object of the present invention to enhance the performance of communication between integrated circuit chips.

Still further, an object of the present invention is to reduce the effect of switching noise on an integrated circuit chip.

In accordance with one embodiment of the present invention, a true/complement integrated circuit device for reducing an amount of simultaneous switching on a bus between a current state and a next state includes a current state register connected to the bus for outputting the current state onto the bus during a first clock cycle. A next state register is provided for containing the next state, wherein the next state is a pending state of the bus intended for a next clock cycle. A comparing means compares a current state value in the current state register with a next state value in the next state register on a bit-by-bit basis. The comparing means determine if the current state value and the next state value are of a same polarity or of an opposite polarity. A ratio determining means is provided for determining a ratio of switching signals from an output of the bit-by-bit comparisons by the comparing means. The ratio determining means is further for generating a true/complement (T/C) signal having a first state if it is determined that more than a prescribed percentage of bits are in transition, the T/C signal having a second state otherwise. Lastly, a complementing means is provided for complementing the bits of the next state register in response to the T/C signal being in the first state, and not complementing the bits of the next state register in response to the T/C signal being in the second state, prior to being transferred into the current state register and output onto the bus during the next clock cycle.

In addition, in accordance with the present invention, the ratio determining and T/C signal generating means includes a bit sorter circuit having an input and an output. The bit sorter circuit receives at its input the output of the comparing means. The bit sorter circuit sorts input bits into a first group of 1's and a second group of 0's, wherein the first group and the second group are arranged in respective order from a least significant bit to a most significant bit at the output of the bit sorter circuit. In addition, a selected output bit of the bit sorter circuit provides the T/C signal, wherein the selected output bit corresponds to the determination that more than the prescribed percentage of bits are in transition.

Still further, in accordance with another embodiment according to the present invention, a method is disclosed for implementing a true/complement bus architecture for reducing an amount of simultaneous switching on a bus between a current state and a next state. The method includes providing a current state register connected to the bus for outputting the current state onto the bus during a first clock cycle. A next state register is provided for containing the next state, wherein the next state is a pending state of the bus intended for a next clock cycle. A current state value in the current state register is compared with a next state value in the next state register on a bit-by-bit basis to determine if the current state value and the next state value are of a same polarity or of an opposite polarity. Next, a ratio of switching signals from an output of the bit-by-bit comparisons of the comparing step is determined and a true/complement (T/C) signal is generated. The T/C signal has a first state if it is determined that more than a prescribed percentage of bits are in transition, whereas the T/C signal has a second state otherwise. Lastly, the bits of the next state register are complemented in response to the T/C signal being in the first state, and not complemented in response to the T/C signal being in the second state, prior to being transferred into the current state register and output onto the bus during the next clock cycle.

Yet still further, another embodiment of the present invention includes a true/complement integrated circuit bus architecture for reducing an amount of simultaneous switching between a current state and a next state. The integrated circuit bus architecture includes a first integrated circuit device, a second integrated circuit device, and a bus interconnecting the first device with the second device. The first device includes (i) a current state register connected to the bus for outputting the current state onto the bus during a first clock cycle, (ii) a next state register for containing the next state, wherein the next state is a pending state of the bus intended for a next clock cycle, (iii) means for comparing a current state value in the current state register with a next state value in the next state register on a bit-by-bit basis to determine if the current state value and the next state value are of a same polarity or of an opposite polarity, (iv) means for determining a ratio of switching signals from an output of the bit-by-bit comparisons by the comparing means and generating a true/complement (T/C) signal having a first state if it is determined that more than a prescribed percentage of bits are in transition, the T/C signal having a second state otherwise, (v) means for complementing the bits of the next state register in response to the T/C signal being in the first state, and not complementing the bits of the next state register in response to the T/C signal being in the second state, prior to being transferred into the current state register and output onto the bus during the next clock cycle, and (vi) means for outputting the T/C signal from the first device during the next clock cycle for accompanying a corresponding next state of the bus.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which:

FIG. 9 is a logic circuit block diagram of a portion of the 32-bit bit sorter of FIG. 8 in further detail.

DETAILED DESCRIPTION OF A PREFERRED EMBODIMENT OF THE INVENTION

Due to the pipeline nature of processors, bus cycles are not a single event, but a pipeline event. In fact, even with a single pending write, the current state of the bus can be treated as the current state, and the pending bus cycle as the next state. Since an output of the output drivers of a VLSI chip are from a latched state, this state would be available to compare with the next bus state. Also, if a read was occurring, and a next state was a write, then the current state would be available on the input receivers, and the next state would be in the pipeline.

Since the current state and the next state are typically available to the processor of the VLSI chip or device, the processor/device has an ability of comparing the value of the current state and the next state on a bit-by-bit basis. The bits are compared to determine if the current state value and the next state value are of the same polarity or of opposite polarity. The output of the bit-by-bit comparisons are then summed to determine if more than half of the bits are in transition. In this manner, the processor is able to determine a ratio of switching signals between a current state and a next state.

If the sum of the current state/next state output comparisons is greater than fifty percent, then in accordance with the present invention, a True/Complement (T/C) driver control complements the next state values as inputs to the output drivers. In addition, for each bus, a T/C state line is driven along with the output data.

On the receiving end, the receiving device monitors the T/C state line for each valid transfer cycle. Depending upon the state of the T/C line, the receiving device will either pass the bus through, or complement the bus to return the bus back to its original value.

By implementing a T/C bus architecture in accordance with the present invention as discussed herein, the resulting possible simultaneously switching transitions are reduced by a factor of fifty percent (50%). This reduction of simultaneous switching results in faster bus cycles. The overhead of the logic circuitry required for implementing the present invention is minor, compared to a gain in system performance achieved by the method and apparatus of the present invention.

Figure 1:
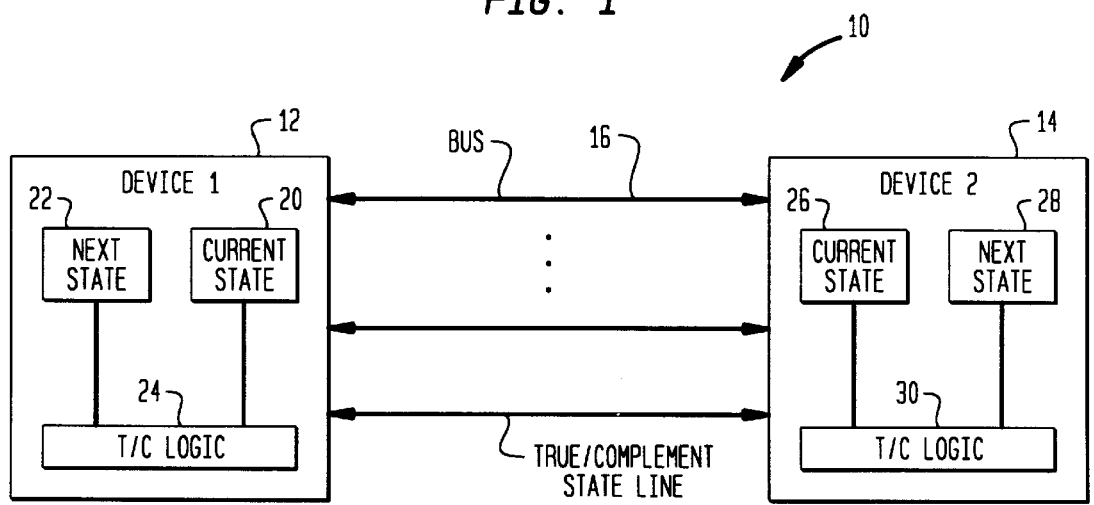
FIG. 1 is a block diagram representation of a method and apparatus for reducing simultaneous switching noise in the transmission of data between first and second VLSI devices in accordance with the present invention.

Turning now to the FIG. 1, a true/complement integrated circuit bus architecture 10 for reducing an amount of simultaneous switching between a current state and a next state is shown. The integrated circuit bus architecture 10 includes a first integrated circuit device 12, a second integrated circuit device 14, and a bus 16. Bus 16 interconnects the first device 12 with the second device 14. For purposes of discussion, the present invention shall be described with reference to a 32-bit bus, however it should be noted that the present invention is equally applicable with respect to different size buses.

The first device 12 is an integrated circuit device which includes a current state register 20, a next state register 22, and true/complement logic circuit 24. Current state register 20 is connected to bus 16 for outputting the current state onto the bus 16 during a first clock cycle. The next state register 22 is for containing the next state, wherein the next state is a pending state of the bus 16 intended for a next clock cycle. Device 14 is similar to device 12, wherein device 14 includes an integrated circuit device having a current state register 26, a next state register 28, an a true/complement logic circuit 30.

Figure 2:
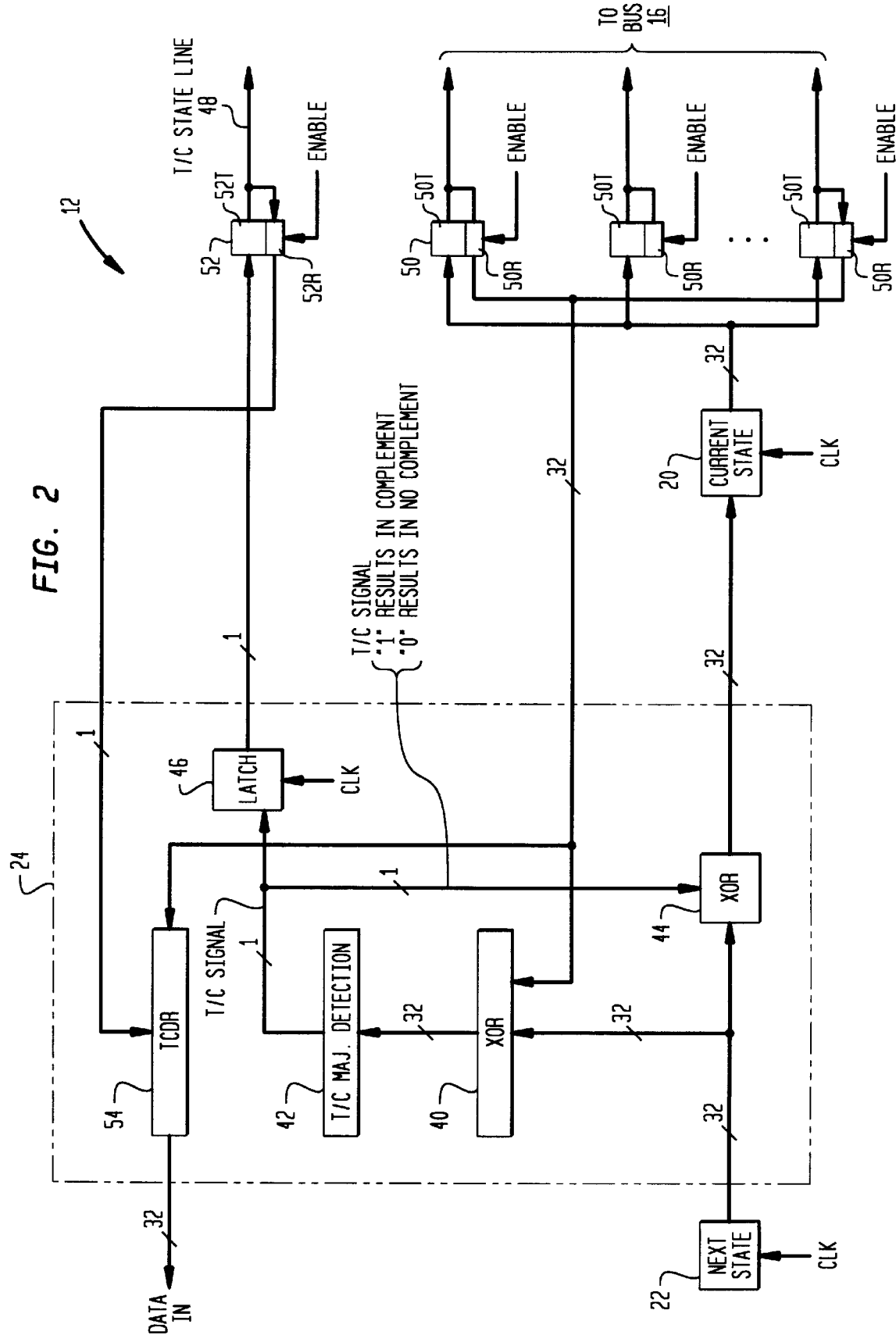
FIG. 2 is a block diagram representation of the true/complement logic control implementation for use in the devices of FIG. 1, in accordance with the present invention.

Turning now to FIG. 2, the true/complement logic circuit 24 of device 12 includes a comparing means 40, a switching signal ratio determining and T/C signal generating means 42, and complementing means 44 for complementing the bits of the next state register 22.

Comparing means 40 includes any suitable means, such as an exclusive OR (XOR) circuit, for comparing a current state value in the current state register 20 with a next state value in the next state register 22 on a bit-by-bit basis. More particularly, comparing means 40 includes an N-bit exclusive OR (XOR) circuit, wherein N is representative of the number of bits of the bus 16. The XOR circuit is for performing an exclusive OR of the current state value with the next state value on a bit-by-bit basis and outputting the results of the bit-by-bit comparisons from a least significant bit to a most significant bit. Such a comparison is carried out to determine if the current state value and the next state value are of a same polarity or of an opposite polarity.

Switching signal ratio determining and T/C signal generating means 42 includes a circuit means, as will be discussed further herein below with respect to FIGS. 3–9, for determining a ratio of switching signals from an output of the bit-by-bit comparisons by the comparing means 40. Circuit means 42 further includes a circuit for generating a true/complement (T/C) signal. The T/C signal has a first state if it is determined that more than a prescribed percentage of bits are in transition, for example, greater than fifty percent (>50%). The T/C signal has a second state, otherwise.

Still referring to FIG. 2, complementing means 44 is provided for complementing the bits of the next state register 22 in response to the T/C signal. Complementing means 44 includes any suitable means, such as an exclusive OR (XOR) circuit, for complementing the bits of the next state register 22 in response to the T/C signal being in the first state, and not complementing the bits of the next state register 22 in response to the T/C signal being in the second state. More particularly, complementing means 44 includes an N-bit exclusive OR (XOR) circuit, the XOR circuit for performing an exclusive OR of the state of the T/C signal with each bit of the next state value of the next state register 22. Complementing means 44 acts upon the bits of the next state register 22 prior to the bits being transferred into the current state register 20 and output onto the bus 16 during a next clock cycle.

Device 12 further includes a means 46 for outputting the T/C signal from the first device 12 during the next clock cycle. The T/C signal is thus provided on a T/C state line for accompanying a corresponding next state of the bus 16. Means 46 includes, for example, an suitable latch. Latch 46 receives the output of the switching signal ratio determining and T/C signal generating means 42. The T/C signal input of latch 46 is latched to the output of latch 46 in accordance with the clock signal Clk, wherein the clock signal is provided by a system clock (not shown).

Device 12 further includes input/output (I/O) drivers 50 and 52, wherein I/O drivers 50 and 52 include transmitter portions 50T,52T and receiver portions 50R,52R, respectively. I/O drivers are known in the art, and thus not discussed in further detail herein. The receiver portions 50R,52R of I/O drivers provide a means for receiving a current state of the bus 16 and a T/C signal accompanying the current state of the bus 16 when device 12 acts as a receiving device in the bus architecture. Additionally, device 12 includes a true/complement driver (TCDR) means 54 responsive to the T/C signal for complementing the current state of the bus 16 prior to receiving the current state into the current state register 20. True/complement driver (TCDR) means 54 includes, for example, any suitable means, such as an exclusive OR (XOR) circuit, for complementing the bits of the current state of the bus 16 in response to the T/C signal being in the first state, and not complementing the bits of the current state of the bus 16 in response to the T/C signal being in the second state. True/complement driver (TCDR) means 54 acts upon the bits of the current state of the bus 16 prior to the bits being received for use by device 12 for a particular purpose.

Turning now to FIGS. 3–9, the ratio determining and T/C signal generating means 42 shall be further described. In a first embodiment, means 42 includes a bit sorter circuit 60 (FIG. 8) having an input 62 and an output 64. The bit sorter circuit 60 is for receiving at its input 62 the output of the comparing means 40. The bit sorter circuit 60 is further for sorting input bits into a first group of 1's (i.e., logic 1's) and a second group of 0's (i.e., logic 0's) arranged in respective order from a least significant bit to a most significant bit. That is, the input bits 62 are sorted into a first group of 1's and a second group of 0's arranged in respective order from a least significant bit to a most significant bit at the output 64 of the bit sorter circuit 60. A selected output bit 66 of the bit sorter circuit 60 provides the T/C signal, wherein the selected output bit 66 corresponds to the determination that more than the prescribed percentage of bits are in transition.

Figure 7:
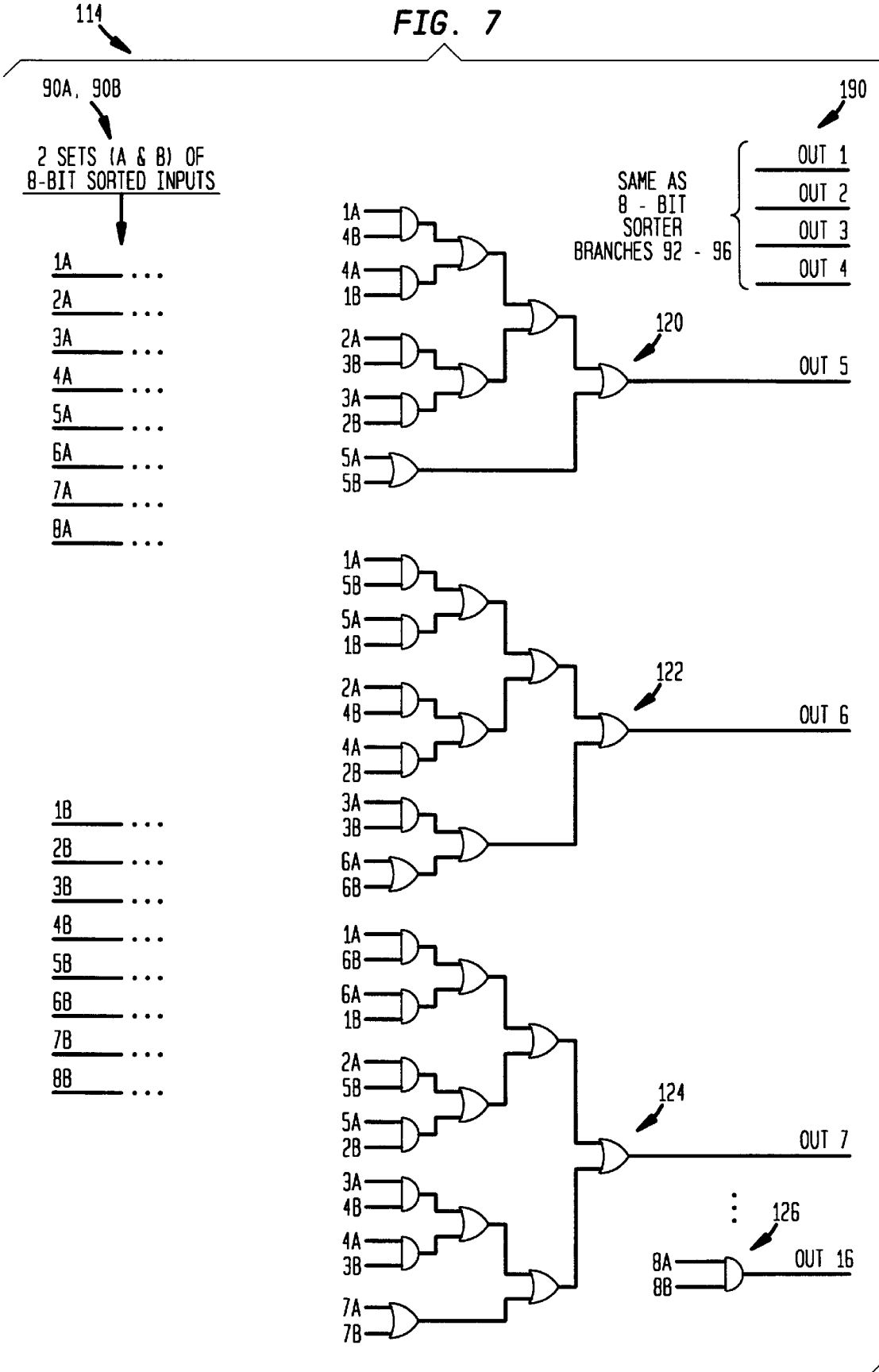
FIG. 7 is a logic circuit block diagram of the 16-bit bit sorter of FIG. 5 in further detail.
Figure 8:
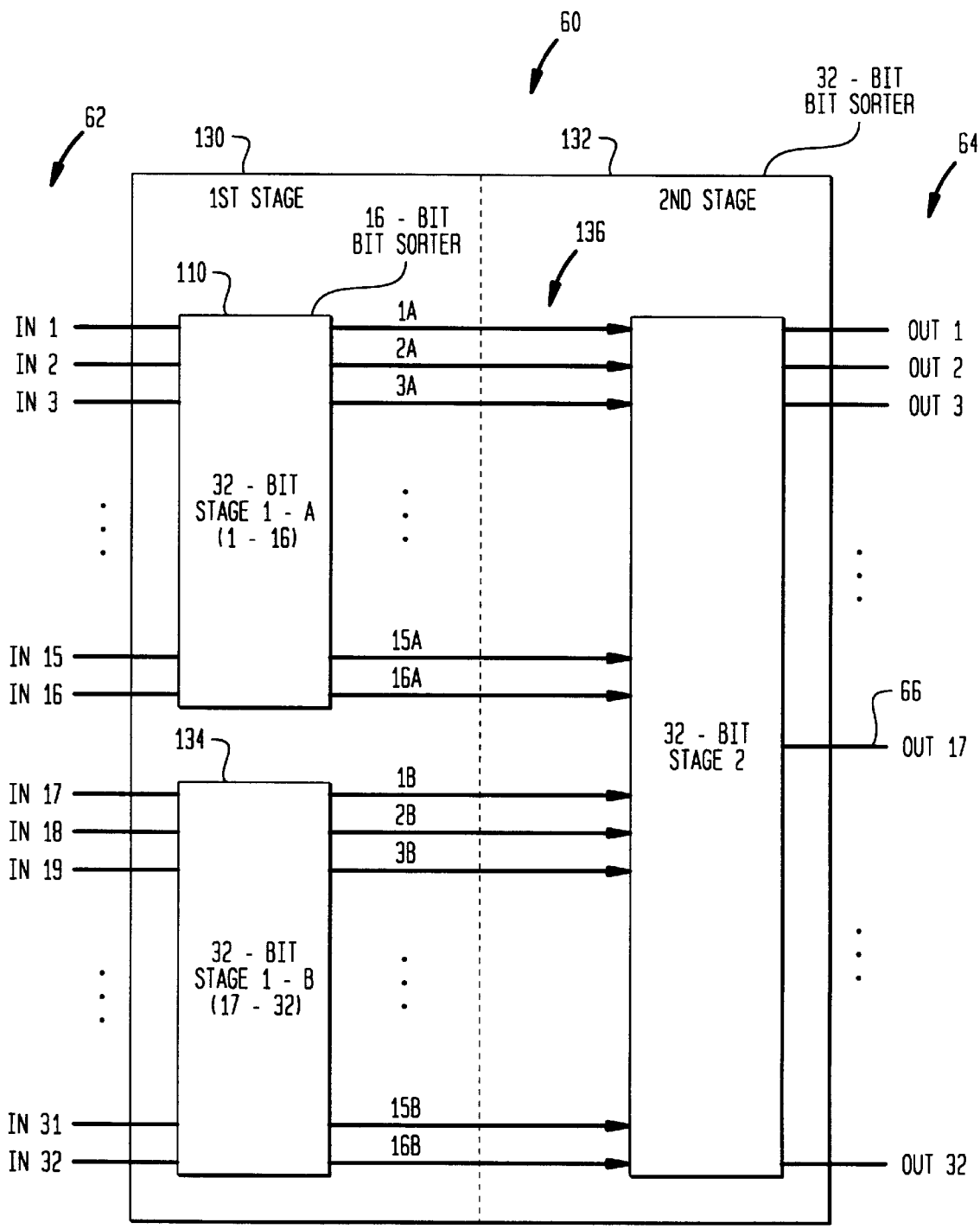
FIG. 8 illustrates block diagram of a 32-bit bit sorter for use in the majority detector in accordance with the present invention.

For purposes of further explanation, a 4-bit bit sorter (FIGS. 3 and 4) shall now be described, followed by a description of an 8-bit bit sorter (FIGS. 5 and 6), a 16-bit bit sorter (FIGS. 5 and 7), and finally, a 32-bit bit sorter (FIGS. 8 and 9).

Figure 3:
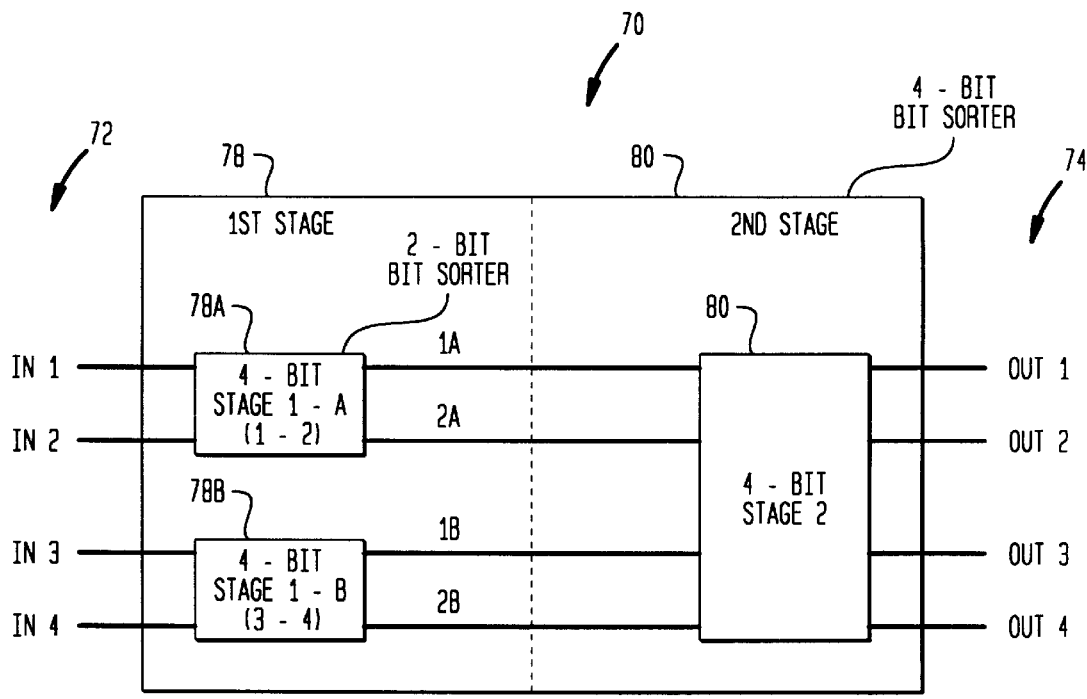
FIG. 3 illustrates block diagram of a 4-bit bit sorter for use in a majority detector in accordance with the present invention.
Figure 4:
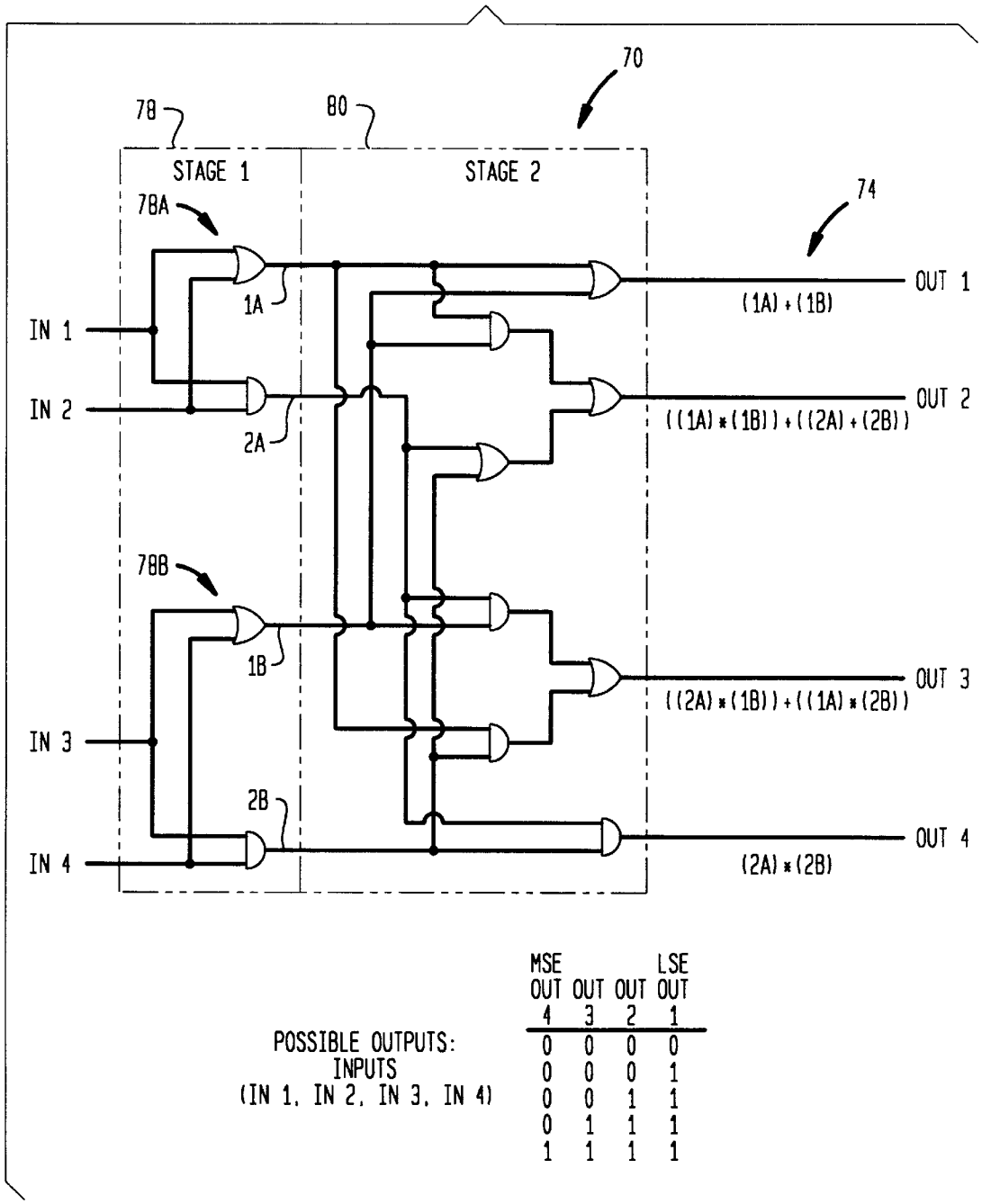
FIG. 4 is a logic circuit block diagram of the 4-bit bit sorter of FIG. 3 in further detail.

Referring now to FIGS. 3 and 4, a 4-bit bit sorter 70 includes an input 72 of four bits IN1–IN4 and an output 74 of four bits OUT1–OUT4. The 4-bit bit sorter circuit 70 is for receiving at its input 72, bits to be sorted. The input bits can include any combination of 1's and 0's. The 4-bit bit sorter circuit 70 sorts the input bits into a first group of 1's and a second group of 0's arranged in respective order from a least significant bit (LSB) to a most significant bit (MSB). That is, the input bits 72 are sorted into a first group of 1's and a second group of 0's arranged in respective order from an LSB to an MSB at the output 64 of the bit sorter circuit 70.

FIG. 4 includes a table of possible outputs for the inputs IN1–IN4. In one instance, the output includes all zero's, indicative of all inputs IN1–IN4 being zero. In another instance, the output includes all one's, indicative that all inputs IN1–IN4 are one. For the output "0001", it is indicative that one of the inputs IN1–IN4 is "1" and the others are "0". A similar analogy applies to the other outputs. In other words, as can be appreciated from the table, the only time that output bit OUT4 is a "1", is when bits OUT3, OUT2, and OUT1 are "1" also. The only time OUT3 can be a "1" is when bits OUT2 and OUT1 are "1". That is, if bit OUT3 is a "1", then of the four input bits IN1–IN4, at least three of them are "1". Thus the name "bit sorter", since the 1's are sorted to the top or right (LSB side) and the 0's are sorted to the bottom or left (MSB side).

Still referring to FIGS. 3 and 4, the 4-bit bit sorter 70 includes a first stage 78 and a second stage 80. First stage 78 includes two sections 78A and 78B. Each section 78A and 78B essentially includes a 2-bit bit sorter. For example, section 78A receives inputs IN1 and IN2 and sorts respective input bits to be arranged with 1's first, then 0's, on the intermediate outputs 1A and 2A, from a LSB to a MSB. The same applies to section 78B, wherein section 78A receives inputs IN3 and IN4 and sorts respective input bits to be arranged with 1's first, then 0's, on the intermediate outputs 1B and 2B, from a LSB to a MSB. Sections 78A and 78B can be implemented using logic gates/circuitry, for example, as shown in FIG. 4. With respect to section 78A, intermediate output 1A is given by the logical expression 1A=((IN1)+(IN2)) and the intermediate output 2A is given by the logical expression 2A=((IN1)·(IN2)). With respect to section 78B, intermediate output 1B is given by the logical expression 1B=((IN3)+(IN4)) and the intermediate output 2B is given by the logical expression 2B=((IN3)·(IN4)).

The second stage 80 of 4-bit bit sorter 70 receives as an input, the sorted groups of intermediate outputs 1A,2A and 1B,2B. As discussed above, intermediate outputs 1A,2A include an ordered output of 1's and 0's arranged from a LSB to a MSB, based upon inputs IN1,IN2. The intermediate outputs 1B,2B include an ordered output of 1's and 0's arranged from a LSB to a MSB, based upon inputs IN3,IN4. Second stage 80 performs a second sort on the two sorted groups of intermediate outputs, wherein the output of the second stage 80 comprises the output 74 of the 4-bit bit sorter 70. Second stage 80 may be implemented using suitable logic gates/circuitry, for example, such as shown in FIG. 4. Output OUT1 is represented by the logical expression OUT1=((1A)+(1B)). OUT2 is represented by the logical expression OUT2=((1A)·(1B))+((2A)+(2B)). OUT3 is represented by the logical expression OUT3=((2A)·(1B))+((1A)·(2B)). OUT2 is represented by the logical expression OUT4=((2A)·(2B)).

Figure 5:
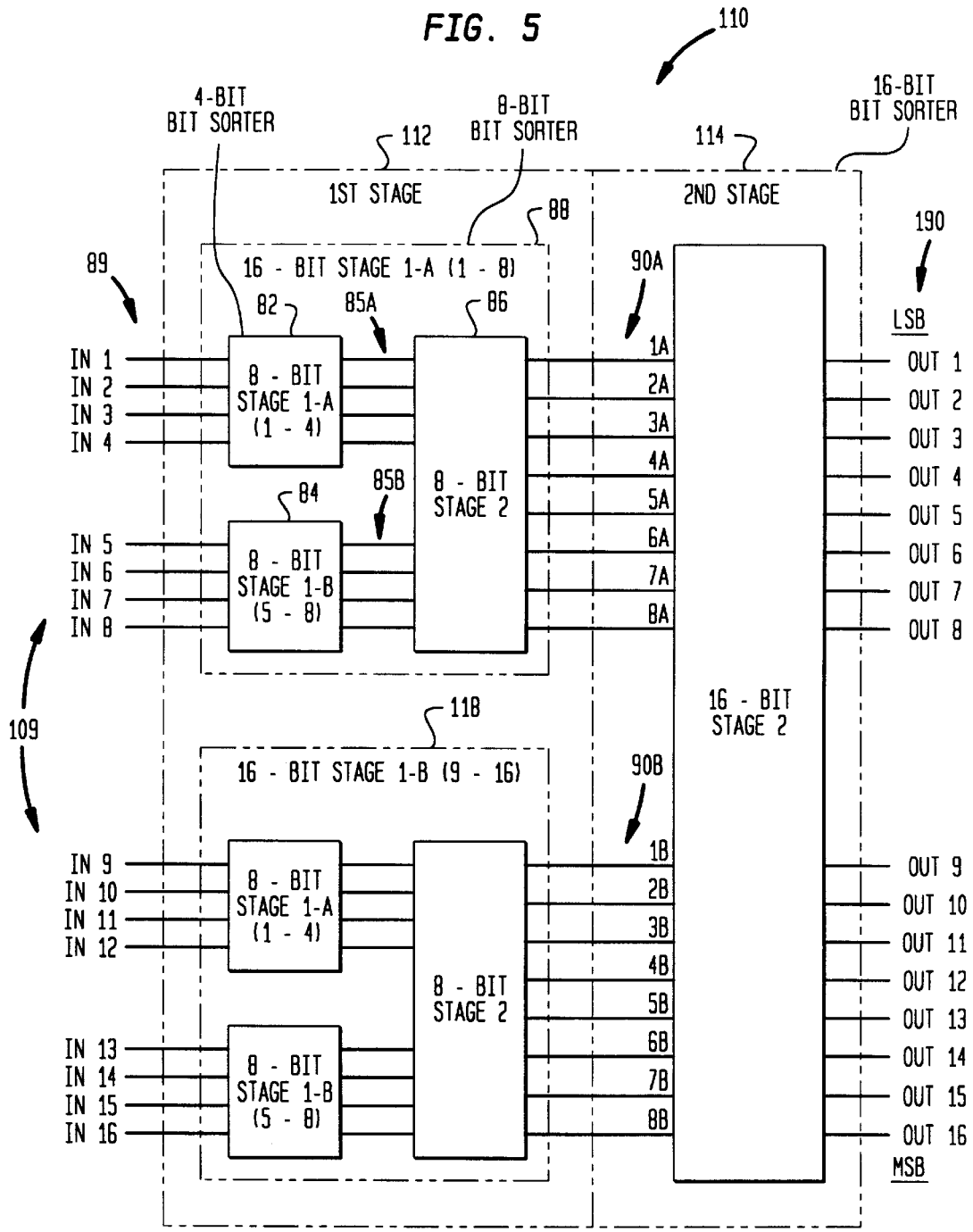
FIG. 5 illustrates block diagram of a 16-bit bit sorter for use in a majority detector in accordance with the present invention.
Figure 6:
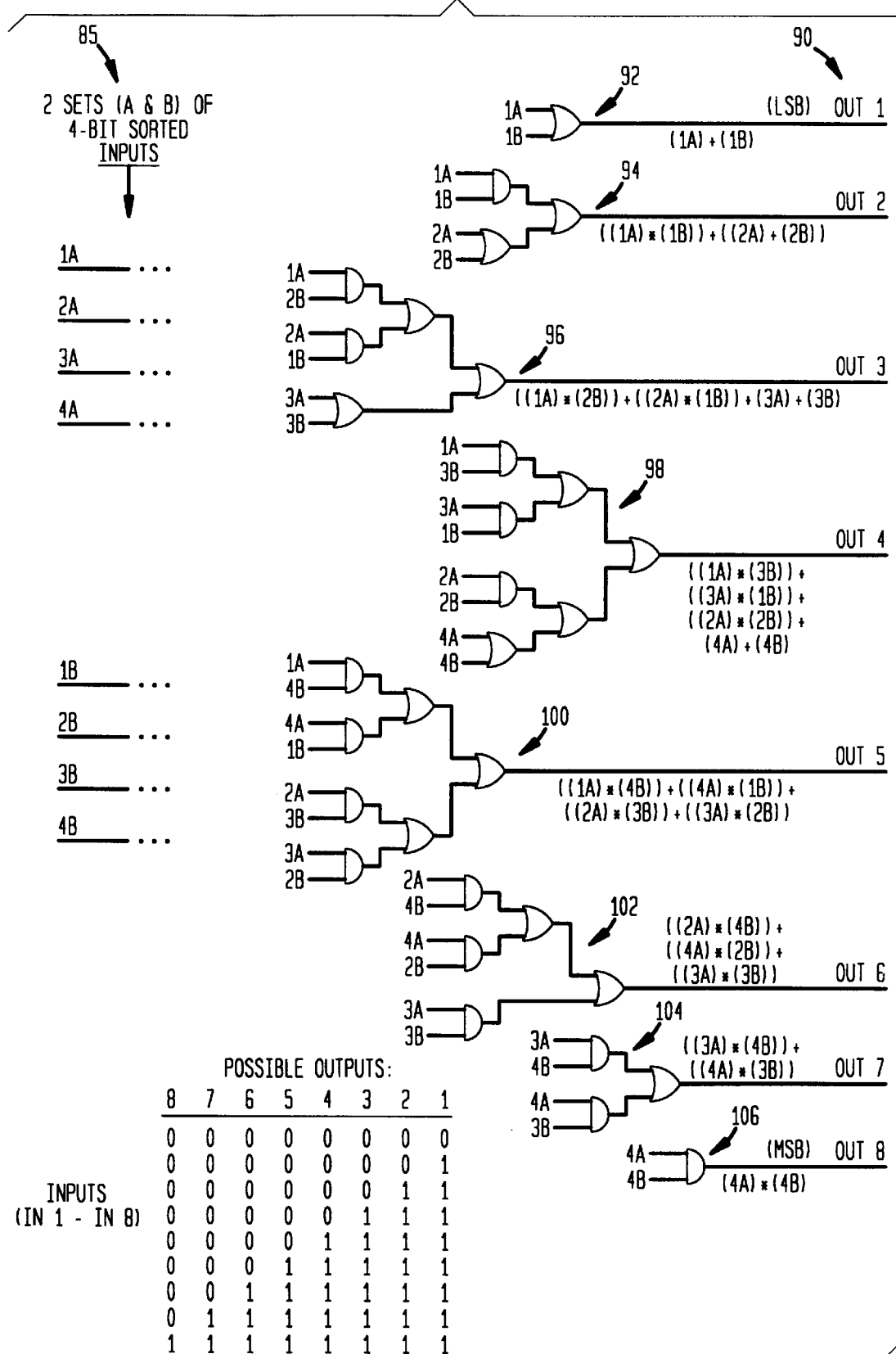
FIG. 6 is a logic circuit block diagram of one of the 8-bit bit sorter incorporated in the 16-bit bit sorter of FIG. 5 in further detail.

Turning now to FIGS. 5–7, the 4-bit bit sorter is used as a building block for making a larger-bit bit sorter. The outputs of two 4-bit bit sorters 82,84 are used for providing intermediate inputs to a second stage 86 of an 8-bit bit sorter 88 (FIG. 5). In other words, the 8-bit bit sorter second stage 86 operates upon two 4-bit inputs of sorted bits, in a similar manner as the second stage 80 of 4-bit bit sorter 70 of FIG. 3 operates upon two 2-bit inputs of sorted bits. The 8-bit bit sorter 88 includes eight (8) inputs 89, corresponding to inputs IN1–IN8 of FIG. 5, and eight (8) outputs 90, corresponding to 1A–8A of FIG. 5. The 8-bit bit sorter 88 functions to sort the bits on the inputs 89 into a first group of 1's and a second group of 0's from a LSB to a MSB on the outputs 90.

FIG. 6 includes a table of possible outputs for the inputs IN1–IN8 of 8-bit bit sorter 88. In one instance, the output includes all zero's, indicative of all inputs IN1–IN8 being zero. In another instance, the output includes all one's, indicative that all inputs IN1–IN8 are one. For the output "00000001", it is indicative that one of the inputs IN1–IN8 is "1" and the others are "0". A similar analogy applies to the other outputs. For instance, as can be appreciated from the table, the only time that output bit OUT4 is a "1", is when bits OUT3, OUT2, and OUT1 are "1" also. The only time OUT3 can be a "1" is when bits OUT2 and OUT1 are "1". That is, if bit OUT3 is a "1", then of the eight input bits IN1–IN8, at least three of them are "1". Thus, the 1's are sorted to the top or right (LSB side) and the 0's are sorted to the bottom or left (MSB side).

The second stage 86 of 8-bit bit sorter 88 receives as an input, the sorted groups of intermediate outputs of 4-bit bit sorters 82 and 84. Further as discussed above, the intermediate outputs each include an ordered output of 1's and 0's arranged from a LSB to a MSB, based upon inputs IN1–IN4 and IN5–IN8, respectively. Second stage 86 performs a second sort on the two sorted groups of intermediate outputs (as inputs to the second stage 86), wherein the output of the second stage 86 comprises the output 90 of the 8-bit bit sorter 88. Second stage 86 may be implemented using suitable logic gates/circuitry, for example, such as shown in FIG. 6. Outputs OUT1–OUT8 (FIG. 6) of 8-bit bit sorter 88 (corresponding to intermediate outputs 90 of FIG. 5) are represented by the logical expressions:

OUT1=((1A)+(1B));

OUT2=((1A)·(1B))+(2A)+(2B);

OUT3=((1A)·(2B))+((2A)·(1B))+(3A)+(3B);

OUT4=((1A)·(3B))+((3A)·(1B))+((2A)·(2B))+(4A)+(4B);

OUT5=((1A)·(4B))+((4A)·(1B))+((2A)·(3B))+((3A)·(2B));

OUT6=((2A)·(4B))+((4A)·(2B))+((3A)·(3B));

OUT7=((3A)·(4B))+((4A)·(3B)); and

OUT8=((4A)·(4B)), corresponding to branches 92, 94, 96, 98, 100, 102, 104, and 106, respectively, further wherein the intermediate inputs 1A–4A, 1B–4B are the outputs 85A,85B of two 4-bit bit sorters 82,84, respectively (FIG. 5).

Turning once again to FIG. 6, a 16-bit bit sorter 110 includes sixteen (16) inputs 109, corresponding to inputs IN1–IN16 of FIG. 5, and sixteen (16) outputs 190, corresponding to OUT1–OUT16 of FIG. 5. The 16-bit bit sorter 110 functions to sort the bits on the inputs 109 into a first group of 1's and a second group of 0's from a LSB to a MSB on the outputs 190. The 16-bit bit sorter 110 includes a first stage 112 and a second stage 114. The first stage 112 includes first and second 8-bit bit sorters, 88 and 118, respectively. For instance, the outputs of two 8-bit bit sorters 88 and 118 are used for providing intermediate inputs to the second stage 114 of the 16-bit bit sorter 110(FIG. 5). In other words, the 16-bit bit sorter second stage 114 operates upon two 8-bit inputs of sorted bits, in a manner similar to that of the second stage 86 of 8-bit bit sorter 88 operates upon two 4-bit inputs of sorted bits.

Referring now to FIG. 7, the second stage 114 of 16-bit bit sorter 110 receives as an input, the sorted groups of intermediate outputs of 8-bit bit sorters 88 and 118. Further as discussed above, the intermediate outputs each include an ordered output of 1's and 0's arranged from a LSB to a MSB, based upon inputs IN1–IN8 and IN9–IN16, respectively of FIG. 5. Second stage 114 performs a second sort on the two sorted groups of intermediate outputs (as inputs to the second stage 114), wherein the output of the second stage 114 comprises the output 190 of the 16-bit bit sorter 110. Second stage 114 may be implemented using suitable logic gates/circuitry, for example, such as shown in FIG. 7. Outputs OUT1–OUT16 (FIGS. 5 and 7) of 16-bit bit sorter 110 are represented by the logical expressions:

OUT1=(1A)+(1B);

OUT2=((1A)·(1B))+(2A)+(2B);

OUT3=((1A)·(2B))+((2A)·(1B))+(3A)+(3B);

OUT4=((1A)·(3B))+((3A)·(1B))+((2A)·(2B))+(4A)+(4B);

OUT5=((1A)·(4B))+((4A)·(1B))+((2A)·(3B))+((3A)·(2B))+(5A)+(5B);

OUT6=((1A)·(5B))+((5A)·(1B))+((2A)·(4B))+((4A)·(2B))+((3A)·(3B))+(6A)+(6B);

OUT7=((1A)·(6B))+((6A)·(1B))+((2A)·(5B))+((5A)·(2B))+((3A)·(4B))+((4A)·(3B))+(7A)+(7B);

OUT8=((1A)·(7B))+((7A)·(1B))+((2A)·(6B))+((6A)·(2B))+((3A)·(5B))+((5A)·(3B))+((4A)·(4B))+(8A)+(8B);

OUT9=((1A)·(8B))+((8A)·(1B))+((2A)·(7B))+((7A)·(2B))+((3A)·(6B))+((6A)·(3B))+((4A)·(5B))+((5A)·(4B));

OUT10=((2A)·(8B))+((8A)·(2B))+((3A)·(7B))+((7A)·(3B))+((4A)·(6B))+((6A)·(4B))+((5A)·(5B)) ;

OUT11=((3A)·(8B))+((8A)·(3B))+((4A)·(7B))+((7A)·(4B))+((5A)·(6B))+((6A)·(5B));

OUT12=((4A)·(8B))+((8A)·(4B))+((5A)·(7B))+((7A)·(5B))+((6A)·(6B));

OUT13=((5A)·(8B))+((8A)·(5B))+((7A)·(6B))+((6A)·(7B));

OUT14=((6A)·(8B))+((8A)·(6B))+((7A)·(7B));

OUT15=((7A)·(8B))+((8A)·(7B)); and

OUT16=(8A)·(8B), wherein only branches 120, 122, 124, and 126, corresponding to the outputs OUT5, OUT6, OUT7, and OUT16, respectively, have been shown in FIG. 7, for simplicity.

Turning now to FIGS. 8 and 9, a 32-bit bit sorter 60 includes thirty-two(32) inputs 62, corresponding to inputs IN1–IN32 of FIG. 8, and thirty-two(32) outputs 64, corresponding to OUT1–OUT32 of FIG. 8. The 32-bit bit sorter 60 functions to sort the bits on the inputs 62 into a first group of 1's and a second group of 0's from a LSB to a MSB on the outputs 64. The 32-bit bit sorter 60 includes a first stage 130 and a second stage 132. The first stage 130 includes first and second 16-bit bit sorters, 110 and 134, respectively. The outputs of the two 16-bit bit sorters 110 and 134 are used for providing intermediate inputs 136 to the second stage 132 of the 32-bit bit sorter 60 (FIG. 8). In other words, the 32-bit bit sorter second stage 132 operates upon two 16-bit inputs of sorted bits, in a manner similar to that of the second stage 114 of 16-bit bit sorter 110 operates upon two 8-bit inputs of sorted bits.

Referring now to FIGS. 8 and 9, the second stage 132 of 32-bit bit sorter 60 receives as an input, the sorted groups of intermediate outputs of 16-bit bit sorters 110 and 134. Further as discussed above, the intermediate outputs each include an ordered output of 1's and 0's arranged from a LSB to a MSB, based upon inputs IN1–IN16 and IN17–IN32, respectively. Second stage 132 performs a second sort on the two sorted groups of intermediate outputs (as inputs to the second stage 132), wherein the output of the second stage 132 comprises the output 64 of the 32-bit bit sorter 60. Second stage 132 may be implemented using suitable logic gates/circuitry, similarly in a manner as shown and discussed previously with respect to FIGS. 5–7 and the second stages of the 8-bit and 16-bit bit sorters, with appropriate modifications.

Of particular interest is output OUT17 of the 32-bit bit sorter 60. OUT17 (corresponding to Branch 17, FIG. 9) is represented by the logical expression:

$$\begin{aligned}OUT17 = \\ ((16A) \cdot (1B)) + ((1A) \cdot (16B)) + ((15A) \cdot (2B)) + ((2A) \cdot (15B)) + \\ ((14A) \cdot (3B)) + ((3A) \cdot (14B)) + ((13A) \cdot (4B)) + ((4A) \cdot (13B)) + \\ ((12A) \cdot (5B)) + ((5A) \cdot (12B)) + ((11A) \cdot (6B)) + ((6A) \cdot (11B)) + \\ ((10A) \cdot (7B)) + ((7A) \cdot (10B)) + ((9A) \cdot (8B)) + ((8A) \cdot (9B)),\end{aligned}$$

wherein the intermediate inputs 1A–16A,1B–16B are the outputs of two 16-bit bit sorters 110 and 134, respectively (FIG. 8). Output OUT17 represents a majority bit of the 32-bit output. By looking at the state a particular output of the bit sorter, we are able to determine whether or not more than a prescribed percentage of the input bits are "1". More particularly, with respect to OUT17 of the 32-bit bit sorter, we are able to determine whether or not a majority of input bits are "1", i.e., greater than fifty percent (>50%). Branch 17 thus acts as the majority detection circuit of a 32-bit majority detector, derived from the second stage 132 of the 32-bit bit sorter 60. If we desired a prescribed percentage of greater than seventy-five percent(>75%), for example, then we would look at the output of OUT25. Thus, any required percentage of input bits being in a first state (i.e., "1") can be quickly determined by looking at the state of an output bit of the bit sorter corresponding to the desired percentage.

In an alternate embodiment, the ratio determining and T/C signal generating means 42 includes an N-bit bit sorter having an input and an output. The N-bit bit sorter is for receiving at its input the output of the comparing means 40 and sorting input bits into a first group of 1's and a second group of 0's. The first group of 1's and second group of 0's are arranged in a respective order from a least significant bit to a most significant bit at the output of the N-bit bit sorter. In addition, a selected output bit of the N-bit bit sorter provides the T/C signal, wherein the selected output bit corresponds to the determination that more than the prescribed percentage of bits are in transition.

In yet another alternate embodiment, the ratio determining and T/C signal generating means 42 includes first and second (N/2)-bit bit sorters. Each (N/2)-bit bit sorter includes an input and an output and are further for receiving a first half of the output of the comparing means 40 and a second half of the output of the comparing means 40 at the input of the first and second (N/2)-bit bit sorters, respectively. The (N/2)-bit bit sorters sort their respective input bits into a first group of 1's and a second group of 0's arranged in respective order from a least significant bit to a most significant bit at their respective outputs. The ratio determining and T/C signal generating means 42 further including a majority detector circuit for receiving the outputs of the (N/2)-bit bit sorters and providing the T/C signal. The majority detector circuit is for determining whether a sum of the first groups of the sorted outputs of the first and second (N/2)-bit bit sorters is greater than a prescribed amount corresponding to the determination that more than the prescribed percentage of bits are in transition.

In further accordance with the present invention, a method for implementing a true/complement bus architecture for reducing an amount of simultaneous switching on a bus between a current state and a next state shall now be discussed. The method includes the steps of providing a current state register connected to the bus for outputting the current state onto the bus during a first clock cycle. A next state register is provided for containing the next state, wherein the next state is a pending state of the bus intended for a next clock cycle. A current state value in the current state register is then compared with a next state value in the next state register on a bit-by-bit basis. Such a comparison facilitates a determination of whether or not the current state value and the next state value are of a same polarity or of an opposite polarity. The comparison step includes providing an N-bit exclusive OR (XOR) circuit, wherein N is representative of the number of bits of the bus, the XOR circuit for performing an exclusive OR of the current state value with the next state value on a bit-by-bit basis and outputting the results of the bit-by-bit comparisons from a least significant bit to a most significant bit. A ratio of switching signals from an output of the bit-by-bit comparisons of the comparing step is then determined and a true/complement (T/C) signal generated. The T/C signal generated has a first state if it is determined that more than a prescribed percentage of bits are in transition, otherwise the T/C signal has a second state. Lastly, the bits of the next state register are complemented in response to the T/C signal being in the first state. The bits of the next state register are not complemented in response to the T/C signal being in the second state. Complementing or not complementing of the bits of the next state register is performed prior to the bits being transferred into the current state register and output onto the bus during the next clock cycle. The complementing step includes providing an N-bit exclusive OR (XOR) circuit, the XOR circuit for performing an exclusive OR of the state of the T/C signal with each bit of the next state value of the next state register.

The method in accordance with the present invention further includes outputting the T/C signal during the next clock cycle for accompanying a corresponding next state of the bus. Still further, the method includes receiving a current state of the bus and a T/C signal accompanying the current state of the bus. In this latter instance, the current state of the bus is complemented in response to the T/C signal, prior to receiving the current state for use on the chip.

In a first manner, the ratio determining and T/C signal generating step includes providing a bit sorter circuit having an input and an output. The bit sorter circuit is for receiving at its input the output of the comparing step and sorting input bits into a first group of 1's and a second group of 0's. The first group of 1's and the second group of 0's are arranged in respective order from a least significant bit to a most significant bit at the output of the bit sorter circuit. A selected output bit of the bit sorter circuit provides the T/C signal, wherein the selected output bit corresponds to the determination that more than the prescribed percentage of bits are in transition.

Alternatively, the ratio determining and T/C signal generating step includes providing an N-bit bit sorter having an input and an output. The N-bit bit sorter is for receiving at its input the output of the comparing step and sorting input bits into a first group of 1's and a second group of 0's. The first group of 1's and the second group of 0's are arranged in respective order from a least significant bit to a most significant bit at the output of the N-bit bit sorter. In this alternate step, a selected output bit of the N-bit bit sorter provides the T/C signal, wherein the selected output bit corresponds to the determination that more than the prescribed percentage of bits are in transition.

In accordance with a still further alternate embodiment, the present invention includes the ratio determining and T/C signal generating step which includes providing first and second (N/2)-bit bit sorters. Each (N/2)-bit bit sorter includes an input and an output. Each are further for receiving a first half of the output of the comparing step and a second half of the output of the comparing step at the input of the first and second (N/2)-bit bit sorters, respectively. The (N/2)-bit bit sorters are for sorting their respective input bits into a first group of 1's and a second group of 0's arranged in respective order from a least significant bit to a most significant bit at their respective outputs. The ratio determining and T/C signal generating step further includes providing a majority detector circuit for receiving the outputs of the (N/2)-bit bit sorters and providing the T/C signal. The majority detector circuit determines whether a sum of the first groups of the sorted outputs of the first and second (N/2)-bit bit sorters is greater than a prescribed amount which corresponds to the determination that more than the prescribed percentage of bits are in transition.

The present invention further provides an additional advantage of reduced power. That is, if the bus frequency remains unchanged (i.e., is not increased) and the switching has been reduced by up to 50%, then an overall power usage will be reduced.

The present invention thus provides a 50% reduction in simultaneous switching of an input/output bus architecture. In addition, packaging cost is kept to a minimum, and bus speed is improved (i.e., provides for a faster bus cycle).

While the true/complement integrated circuit device and bus architecture according to the invention has been shown and described with respect to a 32-bit bus, the true/complement integrated circuit device and bus architecture may equally be implemented for use with other bit size buses. In addition, while the invention has been shown and described as using AND and OR gates for implementation of logic circuitry and functions, it is to be understood that such logic circuitry and functions can equally be carried out using other suitable known techniques, including NANDs, NORs, and invertors.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A true/complement integrated circuit device for reducing an amount of simultaneous switching on a bus between a current state and a next state, said integrated circuit device comprising:
   a current state register connected to the bus for outputting the current state onto the bus during a first clock cycle;
   a next state register for containing the next state, wherein the next state is a pending state of the bus intended for a next clock cycle;
   means for comparing a current state value in said current state register with a next state value in said next state register on a bit-by-bit basis to determine if the current state value and the next state value are of a same polarity or of an opposite polarity;
   means for determining a ratio of switching signals from an output of the bit-by-bit comparisons by said comparing means and generating a true/complement (T/C) signal having a first state if it is determined that more than a prescribed percentage of bits are in transition, the T/C signal having a second state otherwise; and
   means for complementing the bits of said next state register in response to the T/C signal being in the first state, and not complementing the bits of said next state register in response to the T/C signal being in the second state, prior to being transferred into said current state register and output onto the bus during the next clock cycle.

2. The true/complement integrated circuit device of claim 1, further comprising:
   means for outputting the T/C signal, as a separate output signal, during the next clock cycle for accompanying a corresponding next state of the bus.

3. The true/complement integrated circuit device of claim 1, further comprising:
   means for receiving a current state of the bus and a T/C signal accompanying the current state of the bus; and
   means responsive to the T/C signal for complementing the current state of the bus prior to receiving the current state into said current state register.

4. The true/complement integrated circuit device of claim 1; wherein
   said comparing means includes an N-bit exclusive OR (XOR) circuit, wherein N is representative of the number of bits of the bus, the XOR circuit for performing an exclusive OR of the current state value with the next state value on a bit-by-bit basis and outputting the results of the bit-by-bit comparisons from a least significant bit to a most significant bit; and
   said complementing means includes an N-bit exclusive OR (XOR) circuit, the XOR circuit for performing an exclusive OR of the state of the T/C signal with each bit of the next state value of said next state register.

5. The true/complement integrated circuit device of claim 4, further wherein
   said ratio determining and T/C signal generating means includes a bit sorter circuit having an input and an output, the bit sorter circuit for receiving at its input the output of said comparing means and sorting input bits into a first group of 1's and a second group of 0's arranged in respective order from a least significant bit to a most significant bit at the output of the bit sorter circuit, further wherein a selected output bit of the bit sorter circuit provides the T/C signal, the selected output bit corresponding to the determination that more than the prescribed percentage of bits are in transition.

6. The true/complement integrated circuit device of claim 4, wherein
   said ratio determining and T/C signal generating means includes an N-bit bit sorter having an input and an output, the N-bit bit sorter for receiving at its input the output of said comparing means and sorting input bits into a first group of 1's and a second group of 0's arranged in respective order from a least significant bit to a most significant bit at the output of the N-bit bit sorter, further wherein a selected output bit of the N-bit bit sorter provides the T/C signal, the selected output bit corresponding to the determination that more than the prescribed percentage of bits are in transition.

7. The true/complement integrated circuit device of claim 4, wherein
   said ratio determining and T/C signal generating means includes first and second $(N/2)$-bit bit sorters, each $(N/2)$-bit bit sorter having an input and an output and further for receiving a first half of the output of said comparing means and a second half of the output of said comparing means at the input of the first and second $(N/2)$-bit bit sorters, the $(N/2)$-bit bit sorters for sorting their respective input bits into a first group of 1's and a second group of 0's arranged in respective order from a least significant bit to a most significant bit at their respective outputs, said ratio determining and T/C signal generating means further including a majority detector circuit for receiving the outputs of the $(N/2)$-bit bit sorters and providing the T/C signal, the majority detector circuit for determining whether a sum of the first groups of the sorted outputs of the first and second $(N/2)$-bit bit sorters is greater than a prescribed amount corresponding to the determination that more than the prescribed percentage of bits are in transition.

8. A method for implementing a true/complement bus architecture for reducing an amount of simultaneous switching on a bus between a current state and a next state, said method comprising the steps of:
   providing a current state register connected to the bus for outputting the current state onto the bus during a first clock cycle;
   providing a next state register for containing the next state, wherein the next state is a pending state of the bus intended for a next clock cycle;
   comparing a current state value in the current state register with a next state value in the next state register on a bit-by-bit basis to determine if the current state value and the next state value are of a same polarity or of an opposite polarity;

determining a ratio of switching signals from an output of the bit-by-bit comparisons of said comparing step and generating a true/complement (T/C) signal having a first state if it is determined that more than a prescribed percentage of bits are in transition, the T/C signal having a second state otherwise; and complementing the bits of the next state register in response to the T/C signal being in the first state, and not complementing the bits of the next state register in response to the T/C signal being in the second state, prior to being transferred into the current state register and output onto the bus during the next clock cycle.

9. The method for implementing a true/complement bus architecture of claim 8, further comprising the step of:

outputting the T/C signal during the next clock cycle for accompanying a corresponding next state of the bus.

10. The method for implementing a true/complement bus architecture of claim 8, further comprising:

receiving a current state of the bus and a T/C signal accompanying the current state of the bus; and complementing the current state of the bus in response to the T/C signal, prior to receiving the current state for use on the chip.

11. The method for implementing a true/complement bus architecture of claim 8, wherein said comparing step includes providing an N-bit exclusive OR (XOR) circuit, wherein N is representative of the number of bits of the bus, the XOR circuit for performing an exclusive OR of the current state value with the next state value on a bit-by-bit basis and outputting the results of the bit-by-bit comparisons from a least significant bit to a most significant bit; and said complementing step includes providing an N-bit exclusive OR (XOR) circuit, the XOR circuit for performing an exclusive OR of the state of the T/C signal with each bit of the next state value of the next state register.

12. The method for implementing a true/complement bus architecture of claim 11, further wherein said ratio determining and T/C signal generating step includes providing a bit sorter circuit having an input and an output, the bit sorter circuit for receiving at its input the output of said comparing step and sorting input bits into a first group of 1's and a second group of 0's arranged in respective order from a least significant bit to a most significant bit at the output of the bit sorter circuit, further wherein a selected output bit of the bit sorter circuit provides the T/C signal, the selected output bit corresponding to the determination that more than the prescribed percentage of bits are in transition.

13. The method for implementing a true/complement bus architecture of claim 11, wherein said ratio determining and T/C signal generating step includes providing an N-bit bit sorter having an input and an output, the N-bit bit sorter for receiving at its input the output of said comparing step and sorting input bits into a first group of 1's and a second group of 0's arranged in respective order from a least significant bit to a most significant bit at the output of the N-bit bit sorter, further wherein a selected output bit of the N-bit bit sorter provides the T/C signal, the selected output bit corresponding to the determination that more than the prescribed percentage of bits are in transition.

14. The method for implementing a true/complement bus architecture of claim 11, wherein said ratio determining and T/C signal generating step includes providing first and second (N/2)-bit bit sorters, each (N/2)-bit bit sorter having an input and an output and further for receiving a first half of the output of said comparing step and a second half of the output of said comparing step at the input of the first and second (N/2)-bit bit sorters, the (N/2)-bit bit sorters for sorting their respective input bits into a first group of 1's and a second group of 0's arranged in respective order from a least significant bit to a most significant bit at their respective outputs, said ratio determining and T/C signal generating step further including providing a majority detector circuit for receiving the outputs of the (N/2)-bit bit sorters and providing the T/C signal, the majority detector circuit for determining whether a sum of the first groups of the sorted outputs of the first and second (N/2)-bit bit sorters is greater than a prescribed amount corresponding to the determination that more than the prescribed percentage of bits are in transition.

15. A true/complement integrated circuit bus architecture for reducing an amount of simultaneous switching between a current state and a next state, said integrated circuit bus architecture comprising:

a first integrated circuit device;

a second integrated circuit device; and a bus interconnecting said first device with said second device, wherein said first device includes a current state register connected to said bus for outputting the current state onto said bus during a first clock cycle, a next state register for containing the next state, wherein the next state is a pending state of said bus intended for a next clock cycle, means for comparing a current state value on the bus with a next state value in the next state register on a bit-by-bit basis to determine if the current state value and the next state value are of a same polarity or of an opposite polarity, means for determining a ratio of switching signals from an output of the bit-by-bit comparisons by the comparing means and generating a true/complement (T/C) signal having a first state if it is determined that more than a prescribed percentage of bits are in transition, the T/C signal having a second state otherwise, means for complementing the bits of the next state register in response to the T/C signal being in the first state, and not complementing the bits of the next state register in response to the T/C signal being in the second state, prior to being transferred into the current state register and output onto said bus during the next clock cycle, and means for outputting the T/C signal from said first device during the next clock cycle for accompanying a corresponding next state of said bus.

16. The true/complement integrated circuit bus architecture of claim 15, wherein said second device includes a current state register, means for receiving a current state of said bus and a T/C signal accompanying the current state of said bus, and means responsive to the T/C signal for complementing the current state of said bus prior to receiving the current state for use on the chip.

17. The true/complement integrated circuit bus architecture of claim 15, wherein the comparing means includes an N-bit exclusive OR (XOR) circuit, wherein N is representative of the number of bits of said bus, the XOR circuit for performing an exclusive OR of the current state value with the next state value on a bit-by-bit basis and outputting the results of the bit-by-bit comparisons from a least significant bit to a most significant bit; and the complementing means includes an N-bit exclusive OR (XOR) circuit, the XOR circuit for performing an exclusive OR of the state of the T/C signal with each bit of the next state value of the next state register.

18. The true/complement integrated circuit bus architecture of claim 17, further wherein the ratio determining and T/C signal generating means includes a bit sorter circuit having an input and an output, the bit sorter circuit for receiving at its input the output of the comparing means and sorting input bits into a first group of 1's and a second group of 0's arranged in respective order from a least significant bit to a most significant bit at the output of the bit sorter circuit, further wherein a selected output bit of the bit sorter circuit provides the T/C signal, the selected output bit corresponding to the determination that more than the prescribed percentage of bits are in transition.

19. The true/complement integrated circuit bus architecture of claim 17, wherein the ratio determining and T/C signal generating means includes an N-bit bit sorter having an input and an output, the N-bit bit sorter for receiving at its input the output of the comparing means and sorting input bits into a first group of 1's and a second group of 0's arranged in respective order from a least significant bit to a most significant bit at the output of the N-bit bit sorter, further wherein a selected output bit of the N-bit bit sorter provides the T/C signal, the selected output bit corresponding to the determination that more than the prescribed percentage of bits are in transition.

20. The true/complement integrated circuit bus architecture of claim 17, wherein the ratio determining and T/C signal generating means includes first and second ($N/2$)-bit bit sorters, each ($N/2$)-bit bit sorter having an input and an output and further for receiving a first half of the output of the comparing means and a second half of the output of the comparing means at the input of the first and second ($N/2$)-bit bit sorters, the ($N/2$)-bit bit sorters for sorting their respective input bits into a first group of 1's and a second group of 0's arranged in respective order from a least significant bit to a most significant bit at their respective outputs, the ratio determining and T/C signal generating means further including a majority detector circuit for receiving the outputs of the ($N/2$)-bit bit sorters and providing the T/C signal, the majority detector circuit for determining whether a sum of the first groups of the sorted outputs of the first and second ($N/2$)-bit bit sorters is greater than a prescribed amount corresponding to the determination that more than the prescribed percentage of bits are in transition.

* * * * *